(12) United States Patent
Kwon

(10) Patent No.: US 12,264,901 B2
(45) Date of Patent: Apr. 1, 2025

(54) CAMOUFLAGE APPARATUS USING REFLECTIVE DISPLAY

(71) Applicant: KOREA ELECTRONICS TECHNOLOGY INSTITUTE, Seongnam-si (KR)

(72) Inventor: Soon Hyung Kwon, Seongnam-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 0 days.

(21) Appl. No.: 18/136,059

(22) Filed: Apr. 18, 2023

(65) Prior Publication Data

US 2023/0332869 A1  Oct. 19, 2023

(30) Foreign Application Priority Data

Apr. 19, 2022 (KR) .......................... 10-2022-0048333

(51) Int. Cl.
| | |
|---|---|
| *F41H 3/02* | (2006.01) |
| *G02F 1/16753* | (2019.01) |
| *G02F 1/1676* | (2019.01) |
| *G09G 3/20* | (2006.01) |
| *H05K 9/00* | (2006.01) |

(52) U.S. Cl.
CPC .......... *F41H 3/02* (2013.01); *G02F 1/16753* (2019.01); *G02F 1/1676* (2019.01); *G09G 3/2096* (2013.01); *H05K 9/009* (2013.01); *G02F 2203/02* (2013.01); *G02F 2203/11* (2013.01); *G09G 2330/021* (2013.01); *G09G 2354/00* (2013.01); *G09G 2360/04* (2013.01)

(58) Field of Classification Search
CPC .......... F41H 3/02; F41H 3/00; G06F 2113/12; G06F 30/12; G06F 3/04845; G09G 2380/02

See application file for complete search history.

(56) References Cited

U.S. PATENT DOCUMENTS

| | | | |
|---|---|---|---|
| 9,876,380 B1* | 1/2018 | Leabman | H02J 50/23 |
| 2004/0009729 A1* | 1/2004 | Hill | D03D 11/00 |
| | | | 442/181 |
| 2016/0169631 A1* | 6/2016 | Litwin | F41H 3/02 |
| | | | 264/129 |
| 2018/0267382 A1* | 9/2018 | Kwon | H04N 23/11 |
| 2019/0130820 A1* | 5/2019 | Meersman | G09G 3/32 |
| 2020/0066828 A1* | 2/2020 | Meersman | H10K 77/111 |

FOREIGN PATENT DOCUMENTS

KR  10-2018-0057989 A  5/2018

* cited by examiner

*Primary Examiner* — Dong Hui Liang
(74) *Attorney, Agent, or Firm* — Hauptman Ham, LLP

(57) ABSTRACT

A camouflage apparatus using a reflective display is disclosed. The camouflage apparatus includes a camouflage sheet configured to cover an object, thereby hiding the object, and to avoid detection of electromagnetic waves, a plurality of reflective display type panels coupled to one surface of the camouflage sheet and configured to outwardly display a visible-light and infrared camouflage pattern, and a control module configured to control the panels.

14 Claims, 6 Drawing Sheets

CAMOUFLAGE APPARATUS USING REFLECTIVE DISPLAY

CROSS REFERENCE TO RELATED APPLICATION

The present application claims priority to Korean Patent Application No. 10-2022-0048333, filed Apr. 19, 2022, the entire contents of which is incorporated herein for all purposes by this reference.

BACKGROUND OF THE INVENTION

Field of the Invention

The present disclosure relates to a camouflage apparatus using a reflective display.

Description of the Related Art

Camouflage obstructs a military armament from being sensed. In accordance with advances of technologies, various sensing methods have been developed. Recent sensing methods diversely use eyesight, sound, thermal imaging, electromagnetic waves, etc. An existing camouflage pattern is a solution associated with sensing using eyesight. For example, a zebra pattern or the like is painted on an outer surface of armament in order to cope with detection using eyesight at long range.

RELATED ART LITERATURE

Patent Documents

Patent Document 1: KR 10-2018-0057989 A

SUMMARY OF THE INVENTION

Therefore, the present disclosure has been made in view of the above problems, and it is an object of the present disclosure to provide a camouflage apparatus using a reflective display.

In accordance with an aspect of the present disclosure, the above and other objects can be accomplished by the provision of a camouflage apparatus using a reflective display, the camouflage apparatus including a camouflage sheet configured to cover an object, thereby hiding the object, and to avoid detection of electromagnetic waves, a plurality of reflective display type panels coupled to one surface of the camouflage sheet and configured to outwardly display a visible-light and infrared camouflage pattern, and a control module configured to control the panels.

In accordance with an embodiment, each of the panels may include a first substrate, a first electrode disposed at an upper surface of the first substrate, a cell disposed at an upper surface of the first electrode, the cell including a fluid and particles movable in the fluid, a second electrode disposed at an upper portion of the cell and configured to form an electric field together with the first electrode, thereby controlling movement of the particles, and a second substrate disposed at an upper surface of the second electrode while being transparent to visible light and infrared light. The particles may include a first particle including an infrared reflective material while having a first color, and a second particle including an infrared absorbing material while having a second color.

In accordance with an embodiment, the camouflage sheet may include a fabric part configured to support the panels and the control module while having flexibility, and an electromagnetic wave absorption part coupled, in a form of a layer, to the fabric part or formed into a portion of the fabric part, to absorb electromagnetic waves.

In accordance with an embodiment, the camouflage apparatus may further include a control line configured to interconnect the control module and the panels. The control module may include a control unit configured to provide a control signal to the panels in order to control the panels to display a camouflage pattern, a storage unit configured to store the camouflage pattern, an input/output unit configured to receive manipulation of a user and to display a current state, and a power supply unit configured to supply electric power.

In accordance with an embodiment, the control line may be formed at an inner portion or another other surface of the camouflage sheet and may be formed such that an end thereof extends through the camouflage sheet, to be exposed at the one surface of the camouflage sheet.

In accordance with an embodiment, the camouflage apparatus may further include an independent power supply module configured to supply electric power to the control module. The power supply module may be directly connected to each of the panels, to provide electric power to the control module. The control module may include a control unit configured to provide a control signal to the panel in order to control the panel to display a camouflage pattern, a storage unit configured to store the camouflage pattern, and a communication unit configured to transmit and receive a radio signal to and from an outside. The control module may include a plurality of control modules directly coupled to the plurality of panels, respectively, to control corresponding ones of the panels, based on the radio signal received from the outside.

In accordance with an embodiment, the camouflage apparatus may further include an independent power supply module configured to supply electric power to the control module, and a power line configured to interconnect the control module and the power supply module. The power line may be formed at an inner portion or another surface of the camouflage sheet and may be formed such that an end thereof extends through the camouflage sheet, to be exposed at the one surface of the camouflage sheet. The control module may include a control unit configured to provide a control signal to each of the panels in order to control the panel to display a camouflage pattern, a storage unit configured to store the camouflage pattern, and a communication unit configured to transmit and receive a radio signal to and from an outside. The control module may include a plurality of control modules directly coupled to the plurality of panels, respectively, to control corresponding ones of the panels, based on the radio signal received from the outside.

In accordance with an embodiment, the control module may include a control unit configured to provide a control signal to each of the panels in order to control the panel to display a camouflage pattern, a storage unit configured to store the camouflage pattern, a signal receiving unit configured to receive a signal from an independent remote control device, and a power receiving unit configured to electric power from the independent remote control device. The control module may receive electric power from the remote control device in a wireless power transmission manner, and may control the panel based on the signal received from the remote control device.

In accordance with an embodiment, the camouflage apparatus may further include a coupler detachably coupled to the camouflage sheet.

In accordance with an embodiment, the control module may be coupled to the other surface of the camouflage sheet opposite to the one surface of the camouflage sheet to which the panels are coupled.

In accordance with an embodiment, the control module may be disposed between the panels and the camouflage sheet.

Prior to the description, it should be understood that the terms used in the specification and appended claims should not be construed as limited to general and dictionary meanings, but interpreted based on the meanings and concepts corresponding to technical aspects of the present invention on the basis of the principle that the inventor is allowed to define terms appropriately for best explanation.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
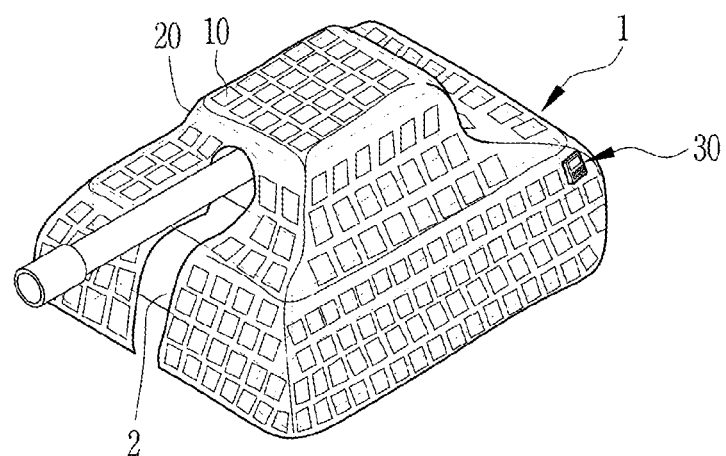
FIG. 1 is a view showing application of a camouflage apparatus using a reflective display according to an exemplary embodiment of the present disclosure to an object.

Objects, particular advantages and new features of the present disclosure will be more clearly understood from the following detailed description and preferred embodiments taken in conjunction with the accompanying drawings. However, the present disclosure is not limited to the embodiments. In the following description, when a detailed description of the relevant known function or configuration is determined to unnecessarily obscure the subject matter of the present disclosure, such detailed description will be omitted.

In the specification, in adding reference numerals for elements in each drawing, it should be noted that like reference numerals already used to denote like elements in one drawing are also used to denote the elements in another drawing wherever possible.

It should be noted that terms used herein are merely used to describe a specific embodiment, not to limit the present disclosure. Incidentally, unless clearly used otherwise, singular expressions include a plural meaning.

Hereinafter, an exemplary embodiment of the present disclosure will be described in detail with reference to the accompanying drawings.

FIG. 1 is a view showing application of a camouflage apparatus 1 using a reflective display according to an exemplary embodiment of the present disclosure to an object 2.

The camouflage apparatus 1 using the reflective display (hereinafter simply referred to as a "camouflage apparatus 1") may include a camouflage sheet 20 configured to cover the object 2, thereby hiding the object 2, and to avoid detection of electromagnetic waves, a plurality of reflective display type panels 10 coupled to the camouflage sheet 20 and configured to outwardly display a visible-light and infrared camouflage pattern, and a control module 30 configured to control the panels 10.

The object 2 may include military armament. For example, the object 2 may include a tank, a self-propelled gun, a panzer, a fighter plane, etc. The object 2 may be supplies, a military tent, etc.

The camouflage apparatus 1 may take the form of a large tent. The camouflage apparatus 1 may be used to directly cover the object 2. The camouflage apparatus 1 may take the form of a structure (for example, a tent or the like) and, as such, may be used to store the object 2 in the structure. The camouflage apparatus 1 may be formed with the panels 10 at one surface thereof. The camouflage apparatus 1 may be used in such a manner that the one surface formed with the panels 10 is directed to an outside, and the other surface opposite to the one surface is directed to the object 2.

As described above, the camouflage apparatus 1 may include the plurality of panels 10 coupled to the camouflage sheet 20, and the control module 30 configured to control the panels 10. Since a camouflage pattern is displayed on each panel 10, the camouflage apparatus 1 may hide the object 2 from sensing using visible light and sensing using infrared light. Since the camouflage sheet 20 absorbs electromagnetic waves, the camouflage apparatus 1 may hide the object from sensing using electromagnetic waves. When the camouflage apparatus 1 covers the object 2, the object 2 may not be sensed from eyesight, a photograph, a thermal image, a radar, etc. of enemy troops.

Figure 2:
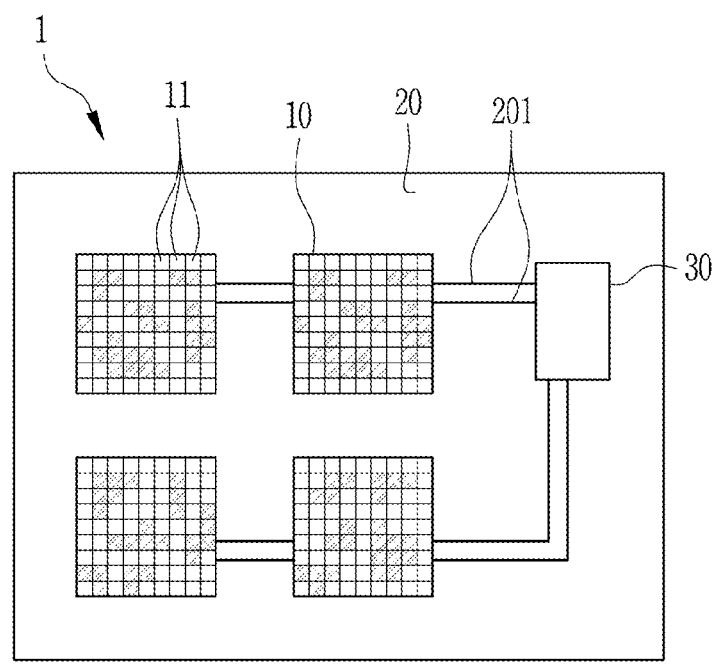
FIG. 2 is a view showing the camouflage apparatus using the reflective display according to the exemplary embodiment of the present disclosure.
Figure 3:
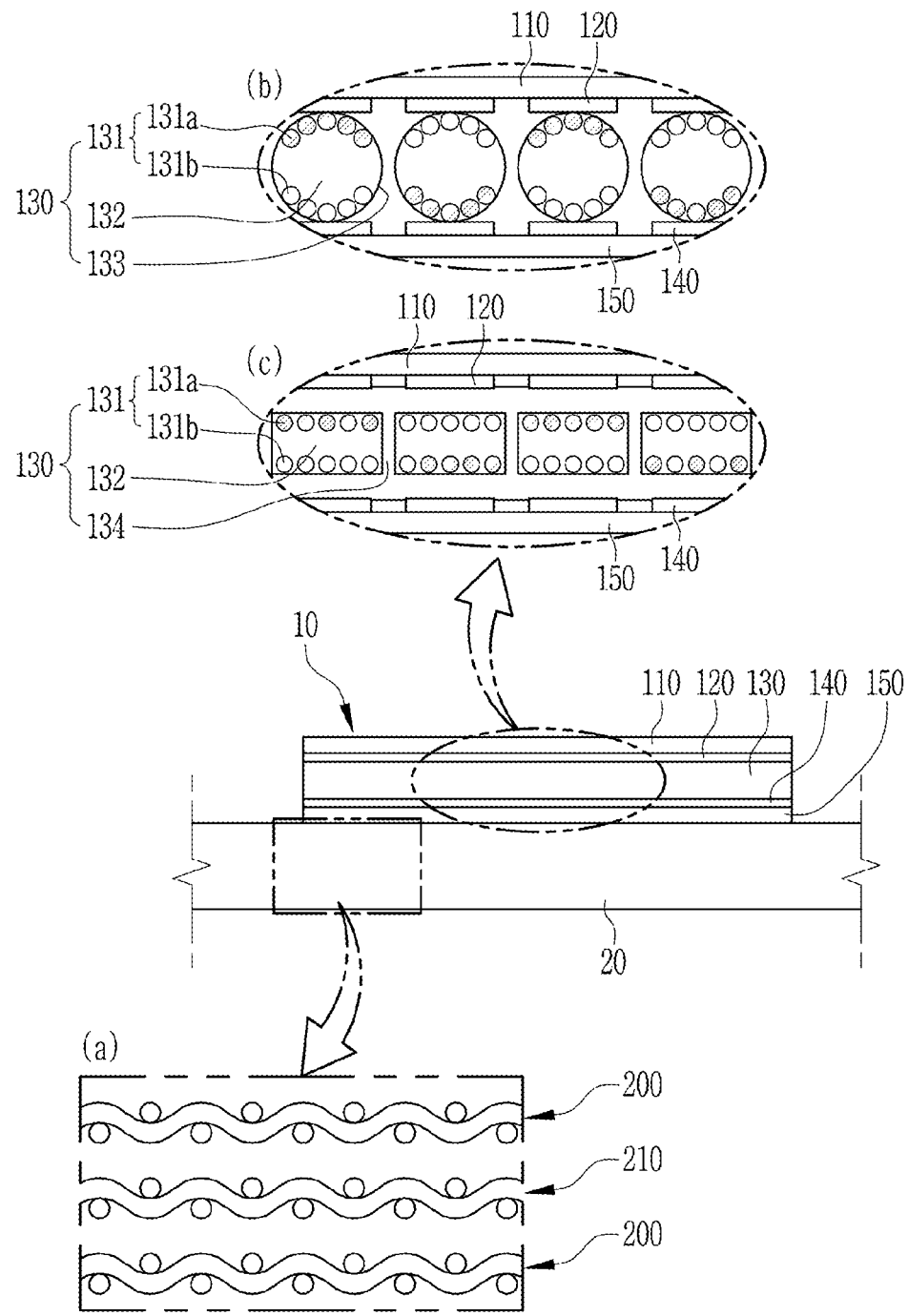
FIG. 3 is a cross-sectional view taken along line A-A' in FIG. 2.

FIG. 2 is a view showing the camouflage apparatus 1 using the reflective display according to the exemplary embodiment of the present disclosure. FIG. 2 shows a part of the camouflage apparatus 1. FIG. 3 is a cross-sectional view taken along line A-A' in FIG. 2.

The plurality of panels 10 may be coupled to one surface of the camouflage sheet 20. The plurality of panels 10 may be disposed to be spaced apart from one another by a predetermined distance. The control module 30 may be coupled to the camouflage sheet 20. The control module 30 may be connected to the panels 10 via a control line 201. The control line 201 may interconnect the control module 30 and the panels 10. The control line 201 may interconnect the panels 10. The control module 30 may be connected to one or a plurality of panels 10 by the control line 201. One panel 10 may be connected to a plurality of panels 10 by the control line 201. Control signals supplied from the control module 30 to the panels 10 may be equal or may be different from one another in accordance with respective panels 10. The control line 201 may supply a control signal to a first electrode 120 and a second electrode 140.

The camouflage sheet 20 may take the form of a fabric, a film, a net, a mesh, or other structures having flexibility. The camouflage sheet 20 may include a fabric part 200 configured to support the panels 10, the control module 30, and the control line 201 while having flexibility. The fabric part 200 may be a fabric woven using natural fibers, synthetic fibers, or the like. The fabric part 200 may be a film formed of synthetic resin. The fabric part 200 may be formed of a material not having electrical conductivity.

The camouflage sheet 20 may include an electromagnetic wave absorption part 210 coupled, in the form of a layer, to the fabric part 200 or formed into a portion of the fabric part 200, to absorb electromagnetic waves. The electromagnetic wave absorption part 210 may take the form of a layer and, as such, may be bonded to the other surface of the fabric part 200.

The electromagnetic wave absorption part 210 may include a material capable of absorbing electromagnetic waves. The electromagnetic wave absorbing material may function to convert electromagnetic waves into thermal energy or the like or to offset phases of incident waves and reflected waves, thereby dissipating energy. The electromagnetic wave absorbing material used in the electromagnetic wave absorption part 210 may be classified into a conductive loss material, a dielectric loss material, a magnetic loss material, etc.

The conductive loss material may include a conductive metal such as gold (Au), silver (Ag), copper (Cu), nickel (Ni), platinum (Pt), or aluminum (Al), powder thereof, silver-plated glass balls, nickel-plated graphite powder, a conductive polymer such as poly(3,4-ethylenedioxythiophene (PEDOT) resin, polyphenylene sulfide-based resin, polypyrrole-based resin, polyaniline-based resin, polyacetylene-based resin, or poly(p-phenylene vinylene)-based resin, or the like.

The dielectric loss material may include lead (Pb), magnesium (Mg), lead-magnesium-niobate, a $PbTiO_3$, ceramic, $BaTiO_3$, carbon nano-fibers (CNFS), or the like. The dielectric loss material may be used in the form of powder. The powder size of the dielectric loss material may be 10 nm to 1,000 μm, and the powder content of the dielectric loss material may be 5 to 20 weight % based on the total weight of the electromagnetic wave absorption part 210.

The magnetic loss material may include Fe, Ni, Co, Mn, Zn, ZnO, an Fe—Ni-based alloy, an Fe—Co-based alloy, an Mn—Zn-based alloy, an Ni—Zn alloy, ferrite, a carbonyl iron-based material, or the like. The magnetic loss material may be used in the form of powder. The powder size of the magnetic loss material may be 10 nm to 10,000 μm, and the powder content of the magnetic loss material may be 5 to 20 weight % based on the total weight of the electromagnetic wave absorption part 210.

The electromagnetic wave absorption part 210 may take the form of a layer coated on one surface or the other surface of the fabric part 200. The electromagnetic wave absorption part 210 may take the form of a film and, as such, may be bonded to one surface or the other surface of the fabric part 200. The electromagnetic wave absorption part 210 may be formed of fibers including one of the conductive loss material, the dielectric loss material, and the magnetic loss material and, as such, may be woven together with fibers of the fabric part 200. An enlarged view (a) of FIG. 3 shows an embodiment of the camouflage sheet 200 in which the camouflage sheet 200 includes the fabric part 200 woven by synthetic fibers, and the electromagnetic wave absorption part 210 woven together with the fabric part 200. The density of fibers including an electromagnetic wave absorbing material may be determined in accordance with the fiber density of the fabric part 200 and the frequency of electromagnetic waves to be absorbed.

The electromagnetic wave absorbing part 210 may absorb electromagnetic waves incident from the outside, and may prevent electromagnetic waves generated from the object 2 from being emitted to the outside. Accordingly, the camouflage sheet 20 may hide the object 2 from sensing using electromagnetic waves.

Enlarged views (b) and (c) of FIG. 3 show a structure of each panel 10. The panel 10 may include, a first substrate 110, a first electrode 120 disposed at an upper surface of the first substrate 110, a cell 130 disposed at an upper surface of the first electrode 120 while including a fluid 132 and particles 131 movable in the fluid 132, a second electrode 140 disposed at an upper portion of the cell 130 and configured to form an electric field together with the first electrode 120, thereby controlling movement of the particles 131, and a second substrate 150 disposed at an upper surface of the second electrode 140 while being transparent to visible light and infrared light.

The first substrate 110 is a lower substrate configured to support the panel 10. The second substrate 150 is an upper substrate of the panel 10 exposed to the outside. The first substrate 110 may be formed of silicon (Si), glass, a ceramic, synthetic resin, or the like. The second substrate 150 may be formed of glass, synthetic resin, or the like. The panel 10 may be coupled to the camouflage sheet 20 such that the first substrate 110 faces one surface of the camouflage sheet 20. The second substrate 150 may be formed of a material transparent to visible light and infrared light. The first electrode 120 is formed at the upper surface of the first substrate 110, the second electrode 140 is formed at the lower surface of the second substrate 150, and the cell 130 is formed between the first electrode 120 and the second electrode 140.

The first electrode 120 and the second electrode 140 may be disposed at lower and upper sides of the cell 130, respectively. Each of the first electrode 120 and the second electrode 140 may be formed of a metal such as copper (Cu), aluminum (Al), silver (Ag), or the like, an alloy including the metal, an electrically-conductive polymer, a carbon nano-tube, indium tin oxide (ITO), graphene, or the like. Each of the first electrode 120 and the second electrode 140 may be formed of a material transparent to visible light. The first electrode 120 and the second electrode 140 may form an electric field in accordance with a control signal, thereby moving particles 131 of the cell 130. A pixel 11 may be defined as an area in which the first electrode 120 and the second electrode 140 may control a direction of the electric field while facing each other. One or more cells 130 may be included in the pixel 11. The first electrode 120 and the second electrode 140 may control the pixel 11 using a control method such as a passive matrix (PM) control method, an active matrix (AM) control method, a segment control method, or the like. In the case in which the panel 10 has a simplified configuration, one first electrode 120 and one second electrode 140 may be formed, and the panel 10 may include only one pixel 11.

The cell 130 may include the fluid 132, and a plurality of particles 131 movable in the fluid 132. The plural particles 131 may have different colors, different electrical polarities, and different charge amounts, respectively. The particles may include an infrared reflective material or an infrared absorbing material. The fluid 132 may be electrically neutral. The fluid 132 may be transparent or may have a color.

For example, the particles 131 may include a first particle 131a including an infrared reflective material while having a first color, and a second particle 131b including an infrared absorbing material while having a second color. The first particle 131a may have a charge amount of minus (−) 1, and the second particle 131b may have a charge amount of plus (+) 1. When the particles 131 are formed, electrical polarities and charge amounts of the particles 131 may be adjusted through adjustment of contents of a charge control agent (CCA) in the particles 131. The first particle 131a and the second particle 131b may be formed to have different sizes. When the particles 131 have different sizes, velocities of the particles 131 moving in the fluid 132 by an electric field may be different. When the particles 131 further include a third particle or a fourth particle, it may be possible to adjust movement velocities of the particles 131 in the fluid 132 by varying sizes, electrical polarities, and charge amounts of the particles 131. The control module 30 may move a desired one of the particles 131 in a desired direction by adjusting the intensity, direction, and maintenance time of the electric field.

When an electric field is formed between the first electrode 120 and the second electrode 140 in the pixel, one of the first particle 131a and the second particle 131b may move toward the second electrode 140. At this time, the color of the particle 131 moved toward the second electrode 140 may be observed when the panel 10 is observed from the outside. It may be possible to control each pixel 11 to exhibit a first color or a second color by controlling movement of the particles 131 in the pixel 11 in the above-described manner. Each particle 131 may include various colors such as beige green, forest green, olive green, charcoal, blue gray, red gray, etc. The control module 30 may control the panel 10 to display a visible-light camouflage pattern in order to avoid sensing using visible light. It may be possible to form the visible-light camouflage pattern by arranging colors of a plurality of pixels 11 in the form of a predetermined pattern.

When the panel 10 is observed in an infrared range, infrared reflectivity of the panel 10 may be varied in accordance with the material included in the particle 131 moved toward the second electrode 140. When the particle 131 moved toward the second electrode 140 includes an infrared absorbing material, the infrared reflectivity of the panel 10 may be decreased. On the other hand, when the particle 131 moved toward the second electrode 140 includes an infrared reflective material, the infrared reflectivity of the panel 10 may be increased. When the infrared reflectivity of the camouflage apparatus 1 is adjusted to be similar to that of an environment around the camouflage apparatus 1, it may be possible to avoid infrared sensing at night. The control module 30 may control the panel 10 to display an infrared camouflage pattern, in order to avoid sensing using infrared light. The infrared camouflage pattern may be formed through arrangement of infrared reflectivity values of a plurality of pixels 11 in the form of a predetermined pattern.

As the infrared reflective material, FeCr of black, CoAl or CoCrAl of blue, CrMgZnAl, CoCrZnTi, or CoNiZnTi of green, MnSbTi, FeCrZnTi, FeZnTi, FeAlTi, FeZn or FeZnCr of brown, CrSbTi or NiSbTi of yellow, or PBaSr of violet may be used. In addition, a vat pigment may be used. As the infrared reflective material, there are titanium oxide, silicon oxide, zinc oxide, copper(II) sulfate pentahydrate, nickel(II) sulfate hexahydrate, zinc sulfate heptahydrate, CeO2, MgO, germanium, silicon, zinc sulfide, zinc selenide, magnesium fluoride, sapphire, arsenic trisulfide, calcium fluoride, and barium fluoride.

As the infrared absorbing material, organic pigments such as dimonium-based, polymethine-based, metal complex-based, squamous-based, and cyanine-based pigments may be used. These organic pigments may effectively absorb near-infrared light in a range of 800 to 1,100 nm. As an inorganic material absorbing infrared light, oxides, nitrides, carbides, oxynitrides, and sulfides of metals such as Sn, Ti, Si, Zn, Zr, Fe, Al, Cr, Co, Ce, In, Ni, Ag, Cu, Pt, Nn, Ta, W, V, Mo. etc. may be used. Among these materials, metal oxides such as indium tin oxide (ITO), antimony tin oxide (ATO), $SnO_2$, $TiO_2$, $SiO_2$, $ZrO_2$, ZnO, $Fe_2O_3$, $Al_2O_3$, FeO, $Cr_2O_3$, $Co_2O_3$, $CeO_2$, $In_2O_3$, NiO, MnO, CuO, $WO_3$, etc. may be used. An additive such as cesium or the like may be added to the metal oxides in order to enhance infrared absorption. As an organic infrared absorbent, amine compounds such as phthalocyanine, naphthalocyanine, anthraquinone, a cyanine compound, a squarylium compound, a thiol nickel complex compound, triarylmethane, naphthoquinone, anthraquinone, N,N,N',N'-tetrakis {p-di (n-butyl) aminophenyl}-phenylenediamine perchlorate, phenylenediamine chlorate, phenylenediamine hexafluoro antimonate, phenylenediamine fluoroborate, phenylenediamine fluorate, etc. may be used.

The control module 30 may display a camouflage pattern on one panel 10 by controlling a plurality of pixels 11 included in the panel 10. The control module 30 may control a plurality of panels 10 to display a camouflage pattern. The control module 30 may control the panels 10 such that the panels 10 display different camouflage patterns, respectively. The control module 30 may control each panel 10 such that the panel 10 displays a visible-light camouflage pattern in daytime, and displays an infrared camouflage pattern at night.

As shown in an enlarged view (b) of FIG. 3, the cell 130 may be formed by a capsule defined between the first electrode 120 and the second electrode 140 by a membrane 133. In this case, the cell 130 may include the fluid 132, the particles 131, and the membrane 133. The cell 130 formed by the capsule may be disposed between the first electrode 120 and the second electrode 140, and may be fixed by a binder. A plurality of cells 130 may be arranged between the first electrode 120 and the second electrode 140, to take the form of a mono-layer.

As shown in an enlarged view (c) of FIG. 3, the cell 130 may be formed in a space defined between the first electrode 120 and the second electrode 140 by a wall 134. In this case, the wall 134 may define a plurality of partitioned spaces in which cells 130 will be formed, respectively. As the fluid 132 and the particles 131 are injected into the partitioned spaces defined by the wall 134, the cells 130 may be formed. The panel 10 may use one of the structures respectively shown in the enlarged views (b) and (c) of FIG. 3.

Figure 4:
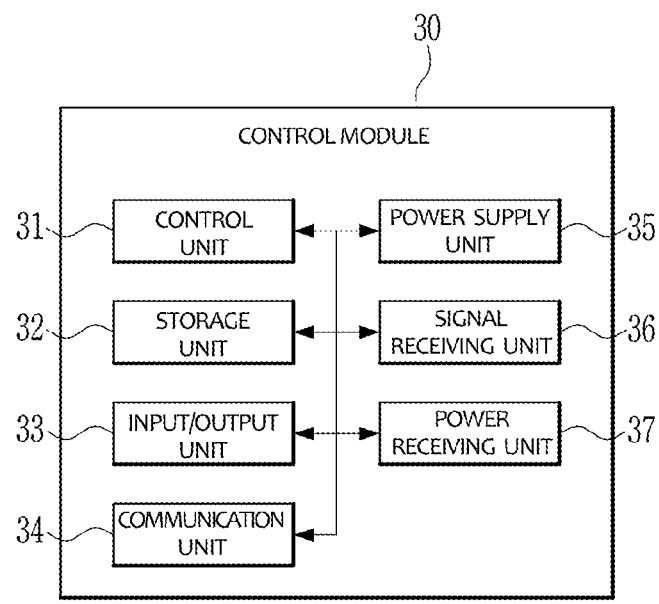
FIG. 4 is a block diagram showing a configuration of a control module according to an embodiment of the present disclosure.

FIG. 4 is a block diagram showing a configuration of the control module 30 according to an embodiment of the present disclosure. The configuration of the control module 30 will be described with reference to FIGS. 2 to 4.

The control module 30 may include one or more of a control unit 31, a storage unit 32, an input/output unit 33, a communication unit 34, a power supply unit 35, a signal receiving unit 36, and a power receiving unit 37. The control unit 31 may apply a control signal to the panel 10, to enable the panel 10 to display a camouflage pattern. The control unit 31 may provide a control signal for controlling the panel 10 to display a visible-light camouflage pattern or an infrared camouflage pattern. The control unit 31 may perform change of a camouflage pattern or switching of an on/off state of the panel 10 in accordance with a command from the user. The controller 31 may include an information processing device such as a processor, a programmable logic device, or the like. The control unit 31 may execute code and/or program commands for implementing an embodiment described in the present specification. For example, the control unit 31 may read out a specific camouflage pattern from the storage unit 32 in accordance with a command input by the user, and may generate and output a control signal for display of the camouflage pattern on the panel 10.

The storage unit 32 may store camouflage patterns, and the code and/or the program commands for implementation of the embodiment described in the present specification. The storage unit 32 may store a visible-light camouflage pattern and an infrared camouflage pattern. The storage unit 32 may include a memory, a non-volatile storage medium, an SD card, or the like. The storage unit 32 may be connected to the control unit 31 and the communication unit 34, for transmission and reception of data.

The input/output unit 33 may receive manipulation of the user, as an input thereof, and may display a current state. The input/output unit 33 may include a touchpad, a button, a switch, or the like, to allow the user to input a command The input/output unit 33 may receive a command from the user, and may transmit the received command to the control unit 31. The input/output unit 33 may display the current state to enable the user to recognize the current state. The input/output unit 33 may include a light emitting diode, a display, a dashboard, etc. The control unit 31 may display the kind of the currently-displayed camouflage pattern, the state of charge of a battery, whether or not failure of the panel 10 has occurred, etc. through the input/output unit 33.

The communication unit 34 may transmit and receive data to and from an external device in a wired or wireless manner The communication unit 34 may transmit a command received from the outside to the control unit 31, and may transmit, to the outside, the current state of the camouflage apparatus 1 provided by the control unit 31.

The power supply unit 35 may provide electric power to the control module 30 and the panel 10. The power supply unit 35 may include a battery. The battery may be a rechargeable secondary cell. The battery may be replaceable. The power supply unit 35 may be connected to an external power source, to receive electric power from the external power source. The power supply unit 35 may take the form of a structure included in an interior of the control module 30.

The signal receiving unit 36 may receive a signal from a remote control device 50 which is independent from the control module 30. The signal receiving unit 36 may transmit and receive data using near-field communication (NFC). The signal receiving unit 36 may be implemented in the form of an antenna or a coil. The signal receiving unit 36 may be implemented to achieve transmission and reception of data under the condition that an externally-exposed terminal of the control module 30 is connected to a terminal of the removed control device 50.

The power receiving unit 37 may receive electric power from the remote control device 50 which is implemented as a device independent from the control module 30. The power receiving unit 37 may receive electric power using wireless power transmission. The power receiving unit 37 may include a coil for wireless power transmission using magnetic induction. The signal receiving unit 36 and the power receiving unit 37 may share one coil with each other.

FIGS. 5, 6, 7, and 8 are views showing various configurations of the camouflage apparatus 1 using the reflective display according to various embodiments of the present disclosure, respectively.

Figure 5:
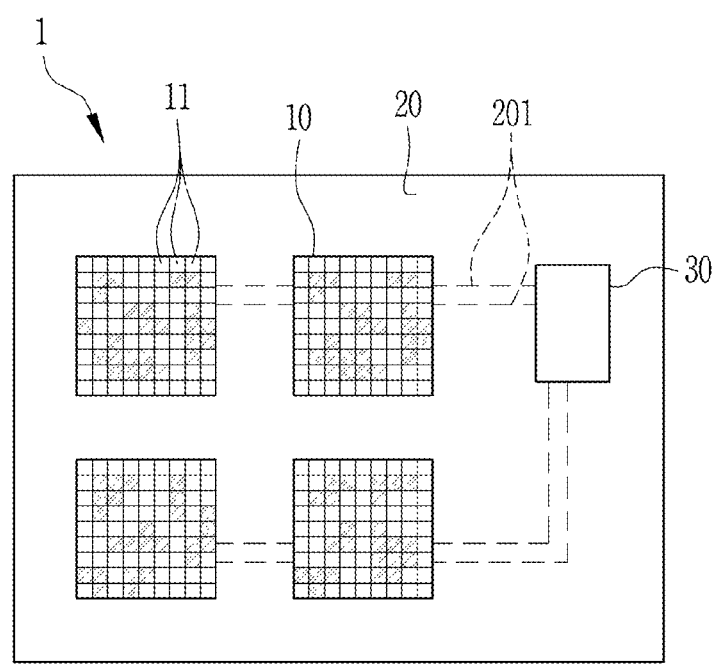
FIGS. 5, 6, 7, and 8 are views showing various configurations of the camouflage apparatus using the reflective display according to various embodiments of the present disclosure, respectively.

Referring to FIG. 5, the camouflage apparatus 1 may further include a control line 201 configured to interconnect the control module 30 and the panels 10. The control module 30 may include a control unit 31 configured to provide a control signal to the panels 10 in order to control the panels to display a camouflage pattern, a storage unit 32 configured to store the camouflage pattern, an input/output unit 33 configured to receive manipulation of the user and to display a current state, and a power supply unit 35 configured to supply electric power. In FIG. 5, the control line 201, which is formed at an inner portion or the other surface of the camouflage sheet 20, is indicated by a dotted line. The control module 30 and the panels 10 may be connected to the control line 201 formed at the camouflage sheet 20.

The control line 201 may be formed at the inner portion or the other surface of the camouflage sheet 20, and may be formed such that an end thereof extends through the camouflage sheet 20, to be exposed at one surface of the camouflage sheet 20. The control line 201 may be disposed at the side of one surface of the camouflage sheet 20, as shown in FIG. 2. When the control line 201 is disposed on the one surface of the camouflage sheet 20, there may be a possibility that the control line 201 is sensed in an electromagnetic band. However, when the control line 201 is formed at the inner portion of the camouflage sheet 20 or on the other surface of the camouflage sheet 20, it may be possible to avoid sensing using electromagnetic waves by the electromagnetic wave absorption part 210 of the camouflage sheet 20.

The control line 201 may be formed using conductive fibers. The control line 201 may be inserted into in the fabric part 200 of the camouflage sheet 20. The control line 201 may be connected to the panels 10 or the control module 30 as the control line 201 is formed at the inner portion or the other surface of the camouflage sheet 20, and the end of the control line 201 is exposed at one end of the camouflage sheet 20. For interconnection of panels 10, the control line 201 may be previously formed at the camouflage sheet 20, and each panel 10 may be connected to a portion of the control line exposed at a predetermined position. Although not shown in FIG. 5, the panel 10 and the control line 201 may be detachably coupled to each other using a connector or the like.

Figure 6:
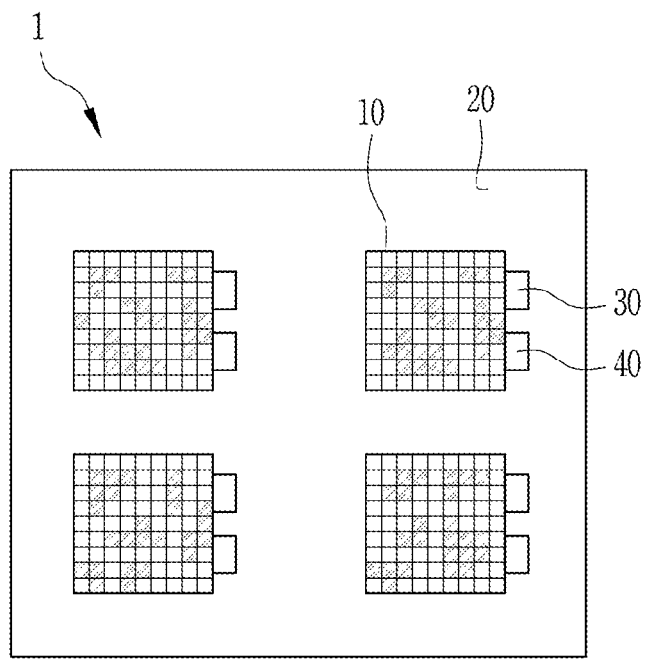

Referring to FIG. 6, the camouflage apparatus 1 may further include an independent power supply module 40 configured to supply electric power to the control module 30. The power supply module 40 may be directly connected to each panel 10, to provide electric power to the control module 30. In this case, the control module 30 may include a control unit 31 configured to provide a control signal to the panel 10 in order to control the panel 10 to display a camouflage pattern, a storage unit 32 configured to store the camouflage pattern, and a communication unit 34 configured to transmit and receive a radio signal to and from the outside. The control module 30 may include a plurality of control modules 30 directly coupled to the plurality of panels 10, respectively, to control corresponding ones of the panels 10, based on the radio signal received from the outside.

At each panel 10, the power supply module 40 is directly coupled to a corresponding one of the control modules 30. In a procedure in which the camouflage sheet 20 is folded or unfolded, a control line 201 or a power line 202 formed at the camouflage sheet 20 may be damaged. In a procedure in which the camouflage apparatus 1 is used, coupling of the control line 201 and the power line 202 to the panels 10, the control modules 30, and the power supply module 40 may be released. However, when the power supply module 40 is coupled to the corresponding control module 30 at each panel 10, the possibility of a connection problem occurring is reduced.

The control module 30 and the power supply module 40 may be connected to the lower surface of the first substrate 110 of the panel 10. That is, the control module 30 and the power supply module 40 may be coupled to a back surface of the panel 10. When the panel 10 is coupled to the camouflage sheet 20, the control module 30 and the power supply module 40 may be disposed between the panel 10 and the camouflage sheet 20. When the control module 30 and the power supply module 40 are disposed at the back surface of the panel 10, the possibility that sensing is avoided in visible-light and infrared ranges may be increased.

Each control module 30 may receive electric power from the separate independent power supply module 40, without including a power supply unit 35. The power supply module 40 may include a replaceable battery, and the battery may be a rechargeable secondary cell. The control module 30 may not include a power supply unit 35 therein. In the control module 30, the communication unit 34 may receive a radio signal transmitted from the outside in a wireless manner, and the control unit 31 may control the panel 10 based on the received radio signal. Each control module 30 may be independently controlled by the radio signal.

Figure 7:
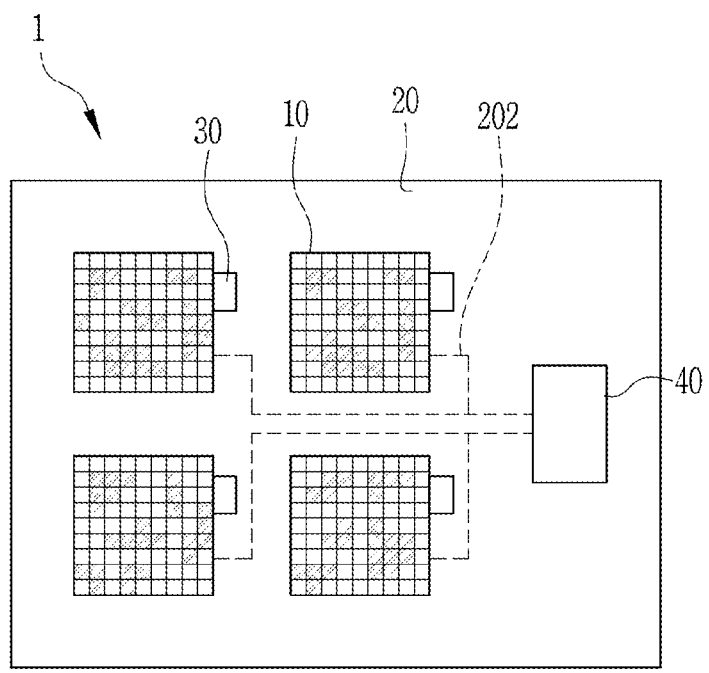

Referring to FIG. 7, the camouflage apparatus 1 may further include an independent power supply module 40 configured to supply electric power to the control module 30, and a power line 202 configured to interconnect the control module 30 and the power supply module 40. The power line 202 may be formed at an inner portion or the other surface of the camouflage sheet 20, and may be formed such that an end thereof extends through the camouflage sheet 20, to be exposed at one surface of the camouflage sheet 20. In this case, the control module 30 may include a control unit 31 configured to provide a control signal to each panel 10 in order to control the panel 10 to display a camouflage pattern, a storage unit 32 configured to store the camouflage pattern, and a communication unit 34 configured to transmit and receive a radio signal to and from the outside. The control module 30 may include a plurality of control modules 30 directly coupled to the plurality of panels 10, respectively, to control corresponding ones of the panels 10, based on the radio signal received from the outside.

The power line 202 may be disposed at the side of one surface of the camouflage sheet 20. When the power line 202 is disposed on the one surface of the camouflage sheet 20, there may be a possibility of the power line 202 being sensed using electromagnetic waves. However, when the power line 202 is formed at an inner portion of the camouflage sheet 20 or on the other surface of the camouflage sheet 20, it may be possible to avoid sensing using electromagnetic waves by the electromagnetic wave absorption part 210 of the camouflage sheet 20.

The power line 202 may be formed using conductive fibers. The power line 202 may be inserted into in the fabric part 200 of the camouflage sheet 20. The power line 202 may be connected to the panel 10 or the control module 30 as the power line 202 is formed at the inner portion or the other surface of the camouflage sheet 20, and the end of the power line 202 is exposed at one end of the camouflage sheet 20. The power line 202 may be previously formed at the camouflage sheet 20, and the panel 10 or the control module 30 may be connected to a portion of the power line 201 exposed at a predetermined position. Although not shown in FIG. 7, the panel 10 and the power line 202 may be detachably coupled to each other using a connector or the like.

The power supply module 40 may be coupled to the other surface of the camouflage sheet 20 and, as such, may be hidden from sensing using electromagnetic waves, visible light, and infrared light. The power module 40 may supply electric power to the plurality of panels 10 and the plurality of control modules 30. When the power supply module 40 is provided at each panel 10, battery replacement may be troublesome. On the other hand, when a single power supply module 40 configured to supply electric power to a plurality of panels 10 or a plurality of control modules 30 is provided, battery replacement is required once only for the single power supply module 40 and, as such, convenience may be provided.

As described above with reference to FIG. 6, each control module 30 may control the panel 10 corresponding thereto, based on a radio signal received from the outside.

Figure 8:
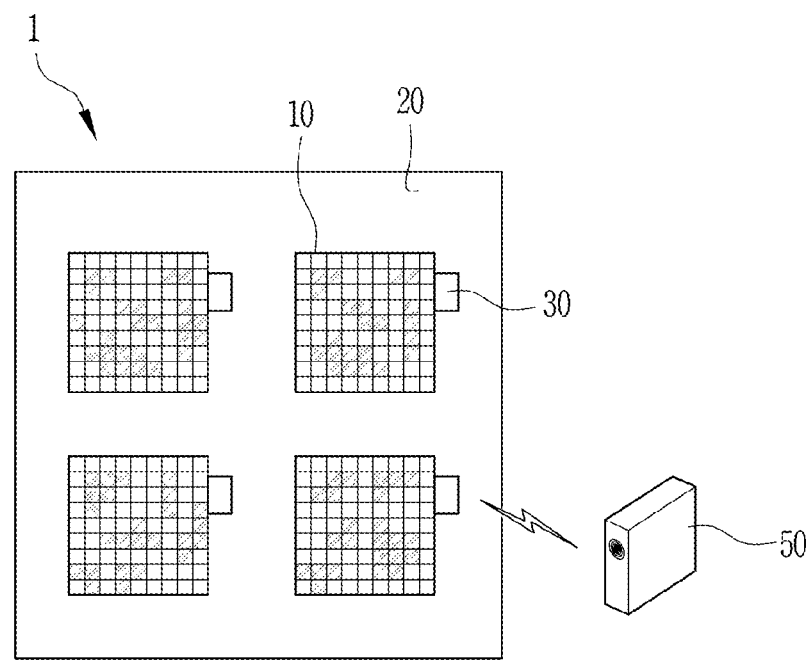

Referring to FIG. 8, the control module 30 may include a control unit 31 configured to provide a control signal to each panel 10 in order to control the panel 10 to display a camouflage pattern, a storage unit 32 configured to store the camouflage pattern, a signal receiving unit 36 configured to receive a signal from an independent remote control device 50, and a power receiving unit 37 configured to receive electric power from the independent remote control device 50. The control module 30 may receive electric power from the remote control device 50 in a wireless power transmission manner, and may control the panel 10 based on a signal received from the remote control device 50. The control module 30 may receive electric power and a signal from the remote control device 50.

The control module 30 and the remote control device 50 may transmit and receive data using near-field communication (NFC). The signal receiving unit 36 and the power receiving unit 37 may be implemented by a single core. The coil may provide a signal while receiving, in real time, electric power for operation of the control module 30 and the panel 10, using electromagnetic induction. When the control module 30 is formed to have a simple structure including the control unit 31, the storage unit 32, and the coil (the signal receiving unit 36 and the power receiving unit 37), failure rate may be reduced, and manufacturing costs may be lowered. The panel 10 is of a reflective display type and, as such, once the particles 131 have moved, display of a camouflage pattern may be maintained even when electric power is not continuously supplied. Accordingly, the structure and function of the control module 30 may be minimized.

Figure 9:
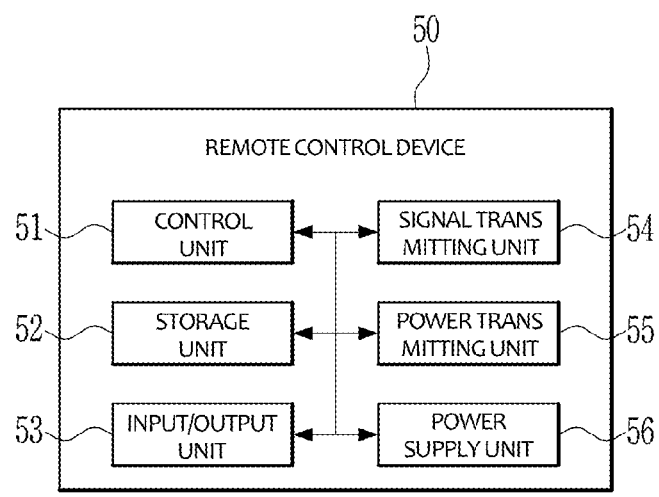
FIG. 9 is a block diagram of a configuration of a remote control device according to an embodiment of the present disclosure.

FIG. 9 is a block diagram of a configuration of the remote control device 50 according to an embodiment of the present disclosure.

The remote control device 50 may include a control unit 51, a storage unit 52, an input/output unit 53, a signal transmitting unit 54, a power transmitting unit 55, and a power supply unit 56. The remote control device 50 may be implemented by a device such as a smartphone or the like. The control unit 51 of the remote control device 50 may generate a signal to be transmitted to the control module 30. The control unit 51 of the remote control device 50 may include an information processing device such as a processor. The input/output unit 53 may receive a command from the user, and may provide a state of the camouflage apparatus 1 to the user. The input/output unit 53 may include an input device such as a keypad, a button, a touchpad, etc., and an output device such as a display, a diode, a speaker, etc.

The storage unit 52 of the remote control device 50 may store a set of commands, program code, etc. for operation of the remote control device 50 according to an embodiment of the present disclosure. The signal transmitting unit 54 and the power transmitting unit 55 may be implemented by a coil. The coil of the remote control device 50 is connected to the coil of the control module 30 in an electromagnetic induction manner and, as such, may transmit both a signal and electric power. The power supply unit 56 of the remote control device 50 may provide electric power required for operation of the remote control device 50, and may provide electric power to be transmitted to the control module 30 via the power transmitting unit 55.

Figure 10:
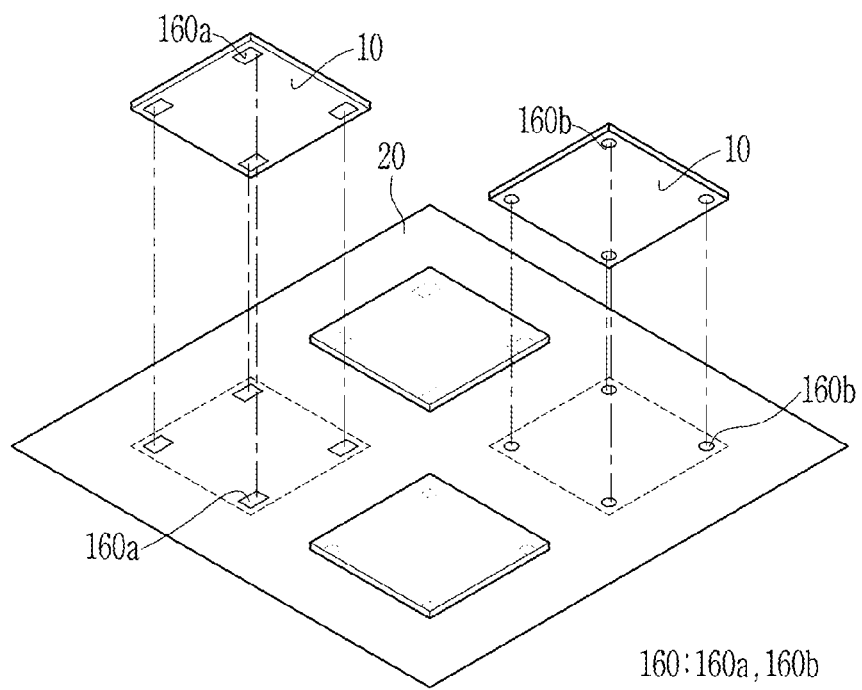
FIG. 10 is a view showing a method of coupling a panel and the reflective display to each other in accordance with an embodiment of the present disclosure.

FIG. 10 is a view showing a method of coupling the panel 10 and the reflective display to each other in accordance with an embodiment of the present disclosure.

The panel 10 may further include a coupler 160 detachably coupled to the camouflage sheet 20. The coupler 160 may use a Velcro tape 160a or a magnet 160b. The coupler 160 fixed to the panel 10 and the coupler 160 fixed to the camouflage sheet 20 may be coupled to each other in a detachable manner As the panel 10 is detachably coupled to the camouflage sheet 20, it may be possible to easily replace the panel 10 with a new one when failure of the panel 10 has occurred.

As apparent from the above description, in accordance with the embodiments of the present disclosure, it may be possible to camouflage military armament from various monitoring systems of enemy troops.

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims.

Simple modifications and alterations fall within the scope of the disclosure, and the protection scope of the disclosure will be apparent from the appended claims.

What is claimed is:

1. A camouflage apparatus using a reflective display, the camouflage apparatus comprising:
   a camouflage sheet configured to cover an object, thereby hiding the object, and to avoid detection of electromagnetic waves;
   a plurality of reflective display type panels coupled to one surface of the camouflage sheet and configured to outwardly display a visible-light and infrared camouflage pattern; and
   a control module configured to control the panels, wherein the camouflage sheet includes:
      a fabric part formed to support the plurality of reflective display type panels; and
      an electromagnetic wave absorption part, in a form of fibers, woven into the fabric part.

2. The camouflage apparatus according to claim 1, further comprising:
   a control line configured to interconnect the control module and the panels,
   wherein the control module comprises:
      a control unit configured to provide a control signal to the panels in order to control the panels to display a camouflage pattern;
      a storage unit configured to store the camouflage pattern;
      an input/output unit configured to receive manipulation of a user and to display a current state; and
      a power supply unit configured to supply electric power.

3. The camouflage apparatus according to claim 2, wherein the control line is formed at an inner portion or another other surface of the camouflage sheet and is formed such that an end thereof extends through the camouflage sheet, to be exposed at the one surface of the camouflage sheet.

4. The camouflage apparatus according to claim 1, wherein the camouflage sheet comprises:
   the fabric part formed of synthetic fibers having flexibility; and
   the electromagnetic wave absorption part formed of fibers including dielectric loss material.

5. The camouflage apparatus according to claim 4, wherein the electromagnetic wave absorption part includes the dielectric loss material in a form of powder.

6. The camouflage apparatus according to claim 1, wherein the camouflage sheet comprises:
   the fabric part formed of synthetic fibers having flexibility; and
   the electromagnetic wave absorption part formed of fibers including magnetic loss material.

7. The camouflage apparatus according to claim 6, wherein the electromagnetic wave absorption part includes the magnetic loss material in a form of powder.

8. The camouflage apparatus according to claim 1, wherein:
   each of the panels comprises:
      a first substrate;
      a first electrode disposed at an upper surface of the first substrate;
      a cell disposed at an upper surface of the first electrode, the cell comprising a fluid and particles movable in the fluid;
      a second electrode disposed at an upper portion of the cell and configured to form an electric field together with the first electrode, thereby controlling movement of the particles; and
      a second substrate disposed at an upper surface of the second electrode while being transparent to visible light and infrared light; and
   the particles comprise:
      a first particle comprising an infrared reflective material while having a first color; and
      a second particle comprising an infrared absorbing material while having a second color.

9. The camouflage apparatus according to claim 1, further comprising:
   an independent power supply module configured to supply electric power to the control module,
   wherein the power supply module is directly connected to each of the panels, to provide electric power to the control module,
   wherein the control module comprises:
      a control unit configured to provide a control signal to the panel in order to control the panel to display a camouflage pattern;
      a storage unit configured to store the camouflage pattern; and
      a communication unit configured to transmit and receive a radio signal to and from an outside, and
   wherein the control module comprises a plurality of control modules directly coupled to the plurality of panels, respectively, to control corresponding ones of the panels, based on the radio signal received from the outside.

10. The camouflage apparatus according to claim 1, wherein:
the control module comprises:
a control unit configured to provide a control signal to each of the panels in order to control the panel to display a camouflage pattern;
a storage unit configured to store the camouflage pattern;
a signal receiving unit configured to receive a signal from an independent remote control device; and
a power receiving unit configured to receive electric power from the independent remote control device, and
wherein the control module receives electric power from the remote control device in a wireless power transmission manner, and controls the panel based on the signal received from the remote control device.

11. The camouflage apparatus according to claim 1, further comprising: a coupler detachably coupled to the camouflage sheet.

12. The camouflage apparatus according to claim 1, wherein the control module is coupled to another surface of the camouflage sheet opposite to the one surface of the camouflage sheet to which the panels are coupled.

13. The camouflage sheet according to claim 1, wherein the control module is disposed between the panels and the camouflage sheet.

14. A camouflage apparatus using a reflective display, the camouflage apparatus comprising:
a camouflage sheet configured to cover an object, thereby hiding the object, and to avoid detection of electromagnetic waves;
a plurality of reflective display type panels coupled to one surface of the camouflage sheet and configured to outwardly display a visible-light and infrared camouflage pattern;
a control module configured to control the panels;
an independent power supply module configured to supply electric power to the control module; and
a power line configured to interconnect the control module and the power supply module,
wherein the power line is formed at an inner portion or another surface of the camouflage sheet and is formed such that an end thereof extends through the camouflage sheet, to be exposed at the one surface of the camouflage sheet,
wherein the control module comprises:
a control unit configured to provide a control signal to each of the panels in order to control the panel to display a camouflage pattern;
a storage unit configured to store the camouflage pattern; and
a communication unit configured to transmit and receive a radio signal to and from an outside, and
wherein the control module comprises a plurality of control modules directly coupled to the plurality of panels, respectively, to control corresponding ones of the panels, based on the radio signal received from the outside.

* * * * *